United States Patent [19]
Sato et al.

[11] Patent Number: 5,416,037
[45] Date of Patent: May 16, 1995

[54] METHOD OF MAKING A SEMICONDUCTOR MEMORY DEVICE

[75] Inventors: Natsuki Sato; Takanori Saeki, both of Tokyo, Japan

[73] Assignee: NEC Corporation, Tokyo, Japan

[21] Appl. No.: 299,885

[22] Filed: Sep. 1, 1994

Related U.S. Application Data

[60] Continuation of Ser. No. 145,508, Nov. 4, 1993, abandoned, which is a division of Ser. No. 784,269, Oct. 29, 1991.

[30] Foreign Application Priority Data

Oct. 29, 1990 [JP] Japan .................. 2-291538
Mar. 7, 1991 [JP] Japan .................. 3-041474

[51] Int. Cl.$^6$ ........................... H01L 21/70
[52] U.S. Cl. ...................... 437/52; 437/47; 437/60; 437/919
[58] Field of Search ............ 437/47, 48, 52, 60, 437/233, 919; 257/306, 307, 308

[56] References Cited

U.S. PATENT DOCUMENTS 4,700,457 10/1987 Matsukawa .................. 437/52
5,021,357 6/1991 Taguchi et al. .............. 437/52

FOREIGN PATENT DOCUMENTS 0295709 12/1988 European Pat. Off. .
120050 5/1989 Japan .
10762 1/1990 Japan .

OTHER PUBLICATIONS

Patent Abstracts of Japan, vol. 13, No. 359 (E-804) (3707), 10 Aug. 1989 & JP14 A-1 120 050 (Hitachi Ltd.), 12 May 1989.
Patent Abstracts of Japan, vol. 14, No. 151 (E-906) (4094), 22 Mar. 1990 & JP-A-2 010 762 (Mitsubishi Electric Corp.), 16 Jan. 1990.
IEDM 88, "3-Dimensional Stacked Capacitor Cell for 16M and 64M Drams", T. Ema et al., pp. 592-595 (1988).

Primary Examiner—Tom Thomas
Attorney, Agent, or Firm—Burns, Doane, Swecker & Mathis

[57] ABSTRACT

In a DRAM which includes a memory cell consisting of one MOS transistor and one stacked capacitor, the node electrode of the capacitor is constituted of a stacked layer formed by alternately stacking a first conductor film and a second conductor film. As the first conductor film use is made of, for example, an n-type polycrystalline silicon film, and as the second conductor film use is made of, for example, an oxygen-rich n-type polycrystalline silicon film, or a silicide film of a high melting point metal. On the side faces of the node electrode, the edges of the first conductor films are at the positions that are more indented than the edges of the second conductor films. Because of the indentations, the surface area of the node electrode is increased so that a stacked capacitor with large capacitance can be realized even when the occupancy area of the capacitor is small. A node electrode with the above-mentioned structure can be formed by first anisotropically etching the stacked film, then by isotropically etching the film. This formation process is succinct, and the manufacturing process is also easy to handle.

3 Claims, 12 Drawing Sheets

METHOD OF MAKING A SEMICONDUCTOR MEMORY DEVICE

This application is a continuation, of application Ser. No. 08/145,508, filed Nov. 4, 1993, now abandoned, which is a divisional of application Ser. No. 07/784,269, filed Oct. 29. 1991.

BACKGROUND OF THE INVENTION

The present invention relates to a semiconductor memory device and the manufacturing method thereof, and more particularly, to the structure of the node electrode of a dynamic random access memory (DRAM) including a memory cell consisting of one MOS transistor and one stacked capacitor and to the manufacturing method thereof.

DESCRIPTION OF THE PRIOR ART

DRAMs having memory cells each consisting of one MOS transistor and one capacitor have been developed with the intention of reducing the occupancy area of the memory cell and to augment the capacitance of the capacitor to a maximum extent possible. The reduction of the occupancy area of the memory cell has mainly been realized by assigning a fine geometry to the MOS transistor, but the occupancy area of the capacitor has also been reduced accordingly. The capacitors have been developed from the planar type through the trench type to the stacked type which has a vertical structure.

In a DRAM which includes a stacked type capacitor, the MOS transistor is constituted by a gate electrode which serves as both a gate insulating film and a word line, a node diffused layer, and a bit diffused layer, and the capacitor is constituted by a node electrode which is connected to the node diffused layer via a node contact hole, a capacitor insulating film, and a cell plate electrode. One of the methods for increasing the capacitance of such a DRAM is to increase the facing area of the node electrode and the cell plate electrode. This is realized mainly by increasing the surface area of the node electrode. As a method for accomplishing this, there is a method of using a node electrode of a fin structure, for example, as reported in IEDM Tech. Dig., 1988, pp. 592-595 by T. Ema, et al. In this report there is reported a structure in which a bit line is formed in the tip layer of a stacked type capacitor and a structure in which a stacked type capacitor is formed above a bit line. A method of forming a memory cell for a DRAM having a node electrode of a fin structure, with the former structure in the report as an example, will be described below.

First, a field oxide film is formed on the surface of a p-type silicon substrate, and forms a transistor consisting of a gate electrode which serves for both of a gate oxide film and a word line, an n-type node diffused layer, and an n-type bit diffused layer. Then, a first interlayer insulating film is deposited all over the surface. At least the surface of the interlayer insulating film is formed of a silicon nitride film. Subsequently, a first silicon oxide film, an n-type first polycrystalline silicon film, and a second silicon oxide film are deposited sequentially.

Next, a node contact hole reaching the node diffused layer is opened by sequentially etching the second silicon oxide film, the first polycrystalline silicon film, the first silicon oxide film, and the first interlayer insulating film. After removing the photoresist film, an n-type second polycrystalline silicon film is deposited all over the surface. Next, using a photoresist provided in the region reserved for a node electrode as the mask, the second polycrystalline silicon film, the second silicon oxide film, the first polycrystalline silicon film, and the first silicon oxide film are removed sequentially by anisotropic etching such as RIE. After removal of the photoresist film, the second silicon oxide film in between the second polycrystalline silicon film and the first polycrystalline silicon film, and the first silicon oxide film in between the first polycrystalline silicon film and the first interlayer insulating film are removed by wet etching that uses hydrofluoric acid, completing a node electrode of fin structure.

Next, a capacitor insulating film is deposited all over the surface. An n-type third polycrystalline silicon film is deposited all over the surface, and a cell plate electrode is formed by etching the film. The exposed capacitor insulating film is removed by etching that uses the cell plate electrode as the mask, completing a stacked type capacitor. Next, a second interlayer insulating film is deposited all over the surface, and a bit contact hole is opened by sequentially etching the second interlayer insulating film and the first interlayer insulating film on the bit diffused layer. A bit line which is connected to the bit diffused layer via the bit contact hole is formed, completing a memory cell of the DRAM.

However, a method such as in the above which attempts to increase the surface area of the node electrode by means of the fin structure has a working process which is complicated and difficult. Namely, in realizing the structure of the node electrode, the mechanical strength of the node electrode is deteriorated in the stage of removing by etching the silicon oxide film placed between the polycrystalline silicon films, and the processes of washing and the like will be difficult.

BRIEF SUMMARY OF THE INVENTION

Object of the Invention

It is an object of the present invention to provide a DRAM which includes a memory cell consisting of one MOS transistor and one stacked type capacitor.

It is an object of the present invention to provide a DRAM which includes a high density memory cell.

It is an object of the present invention to provide a DRAM which includes a high density memory cell and a large capacitance stacked type capacitor.

It is an object of the present invention to provide a DRAM which includes a node electrode of a stacked type capacitor with large facing area.

It is an object of the present invention to provide a manufacturing method for a DRAM which includes a memory cell consisting of one MOS transistor and one stacked type capacitor.

It is an object of the present invention to provide a manufacturing method for a DRAM which includes a high density memory cell.

It is an object of the present invention to provide a manufacturing method for a DRAM which includes a high density memory cell and a large capacitance stacked type capacitor.

It is an object of the present invention to provide a manufacturing method for a DRAM which includes a node electrode of a stacked type capacitor with large facing area, wherein the manufacturing process of the node electrode is sample and stabilized.

SUMMARY OF THE INVENTION

The dynamic random access memory having a stacked capacitor according to the present invention is characterized in that it includes a node electrode of stacked capacitor consisting of a stacked film formed by alternately stacking a first conductor film and a second conductor film, and on the side faces of the stacked film, the edges of the first conductor films are situated at positions that are more indented than the edges of the second conductor films.

The first conductor film is preferably made of an n-type polycrystalline silicon film. The second conductor film is preferably made of an oxygen-rich n-type polycrystalline silicon film or a silicide film of a high melting point metal. When the first conductor film is an n-type polycrystalline silicon film and the second conductor film is a high melting point metallic silicide film, it is preferable that the bottom face of the node electrode is an n-type polycrystalline silicon film and the top face of the node electrode is a high melting point metallic silicide.

In the semiconductor memory device according to the present invention, on the side faces of the node electrode formed of the stacked film obtained by alternately stacking the first conductor film and the second conductor film, the surface area of the side faces are increased due to indentations by the second conductor films. Because of this, a node with large facing area can be obtained even when the occupancy area of the stacked type capacitor is decreased, and a DRAM having a high density memory cell and a large capacity stacked type capacitor can be realized. Even though the increase the surface area of the side faces of the node electrode due to a single intentation may be small, the increase in the surface area of the side faces of the node electrode can easily be achieved in the present invention since the number of indentations can be increased by augmenting the number of stacking of the stacked films.

The manufacturing method of the semiconductor memory device according to the present invention includes, in the manufacture of the node electrode of a dynamic random access memory consisting of one MOS transistor and one stacked capacitor, a process of forming on the surface of a p-type silicon substrate an MOS transistor consisting of a gate electrode serving for both of a gate insulating film and a word line, an n-type node diffused layer, and an n-type bit diffused layer, depositing an interlayer insulating film all over the surface, and opening a node contact hole reaching the node diffused layer in the interlayer insulating film, a process of forming a stacked film by alternately stacking a first conductor film and a second conductor film, a process of forming a photoresist film in a region reserved for forming a node electrode, and anisotropically etching the stacked film by using the photoresist film as the mask, and a process of isotropically etching at least the surface of the stacked film exposed by the anisotropic etching.

When the first conductor film consists of an n-type polycrystalline silicon film and the second conductor film consists of an oxygen-rich n-type polycrystalline silicon film, the formation process of the stacked film preferably includes a process of forming a first stacked film consisting of undoped polycrystalline silicon films and oxygen-rich undoped polycrystalline silicon films obtained by alternate deposition of an undoped polycrystalline silicon film and formation of an oxygen-rich undoped polycrystalline silicon film on the surface of the undoped polycrystalline silicon film by exposing the undoped polycrystalline silicon film to an oxygen atmosphere, and a process of diffusing phosphorus into the first stacked film. An alternative method of forming the stacked film includes preferably a process of alternate deposition of an n-type polycrystalline silicon film by a CVD that employs a silane system gas that contains phosphine, and formation of an oxygen-rich n-type polycrystalline silicon film on the surface of the n-type polycrystalline silicon film by exposing the n-type polycrystalline silicon film to an oxygen atmosphere, and a process of subjecting the sample to a heat treatment in an inert atmosphere.

When the first conductor film consists of an n-type polycrystalline silicon film and the second conductor film consists of a silicide of a high melting point metal, the formation method of the node electrode preferably includes a process of forming a second stacked film by alternate deposition of an undoped polycrystalline silicon film and the silicide film of the high melting point metal, a process of anisotropically etching the second stacked film by forming a photoresist in a region reserved for formation of a node electrode, a process of removing the photoresist film and converting the undoped polycrystalline silicon film to an n-type polycrystalline silicon film by diffusing phosphorus in the undoped polycrystalline silicon film, and the process of subjecting the sample to an isotropic etching. An alternative method of forming the node electrode preferably includes a process of alternate formation of an n-type polycrystalline silicon film and a silicide film of a high melting point metal.

It is preferable that the isotropic etching in the above is a dry etching by a gas that contains at least tha sulfur hexafluoride gas.

In accordance with the manufacturing method of a semiconductor memory device according to the present invention, the node electrode is formed by anisotropically etching a stacked film consisting of a first conductor film and a second conductor film, and further isotropically etching the stacked film. In accordance with the manufacturing method of the present invention, the component materials, the etchant gas for the isotropic etching, and the etching conditions for the first conductor film and the second conductor film are selected so as to have the etching rate of the first conductor film in the isotropic etching greater than the etching rate of the second conductor film, and the edges of the first conductor films exposed on the side faces of the node electrode are formed so as to be situated at positions more indented than the edges of the second conductor films exposed on the side faces of the node electrode. Because of this, there can be formed a node electrode with greater surface area of the side faces by a simpler manufacturing method than the conventional method. Moreover, by adopting the above-mentioned manufacturing process, the deterioration in the mechanical strength during the manufacture of the node electrode will not take place, making it possible to obtain a stabilized manufacturing method.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE PREFERRED EMBODIMENTS

Figure 1A:
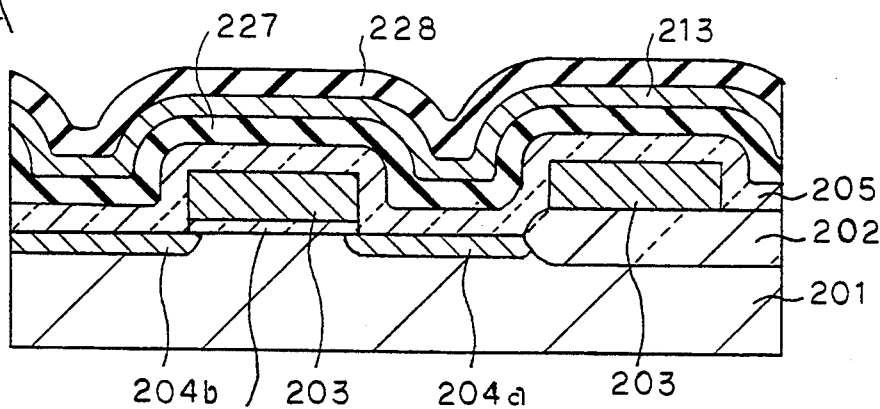
FIGS. 1A to 1E are schematic sectional views arranged in the order of processes to describe the manufacturing method of a DRAM including a conventional stacked type capacitor having a fin type node electrode.

Prior to the description of the present invention, the structure and the manufacturing method of the node electrode of a DRAM having a memory cell consisting of a conventional stacked type capacitor will be described by referring to the drawings.

As a method of increasing the surface area of the node electrode, one may mention the report by T. Ema, et al. who adopted a fin type node electrode. Referring to FIGS. 1A to 1E, the contents of the report will briefly be described.

First, a field oxide film 202 is formed on the surface of a p-type silicon substrate 201, and an MOS transistor consisting of a gate electrode 203 which serves for both of a gate oxide film 202a and a word line, an n-type node diffused layer 204a, and an n-type bit diffused layer 204b is formed. Then, a first interlayer insulating film 205 is deposited all over the surface. At least the surface of the interlayer insulating film 205 is formed of a silicon nitride film. Subsequently, a silicon oxide film 227, a first n-type polycrystalline silicon film 213, and a silicon oxide film 228 are formed sequentially (FIG. 1A).

Figure 1B:
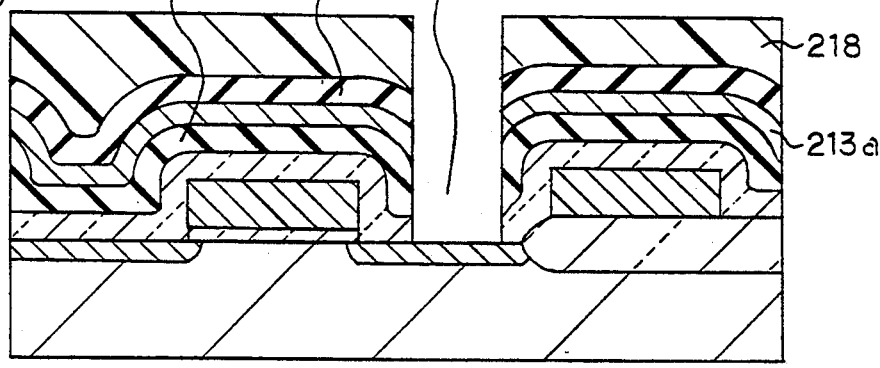

Next, a photoresist film 218 which has an opening at the position where a node contact hole is to be created is formed, and a node contact hole 206a which reaches the node diffused layer 204a is opened by etching sequentially the silicon oxide film 228, the polycrystalline silicon film 212, the silicon oxide film 227, and the interlayer insulating film 205. As a result of the etching, the silicon oxide film 228, the polycrystalline silicon film 213, and the silicon oxide film 227 become a silicon oxide film 228a, a polycrystalline silicon film 213a, and a silicon oxide film 227a, respectively (FIG. 1B).

Figure 1C:
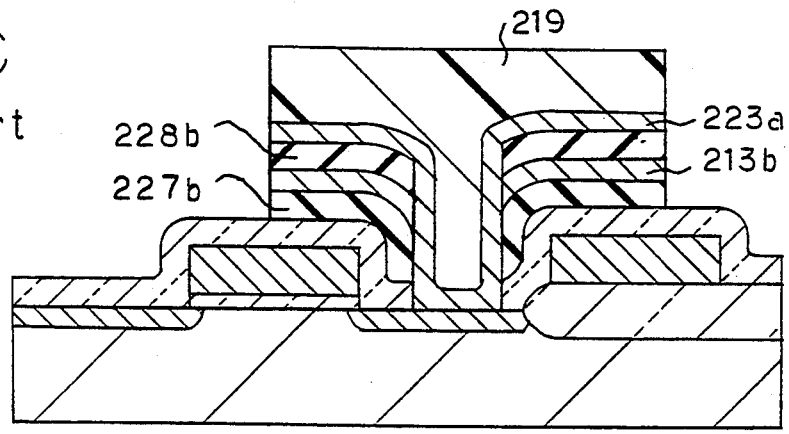

Next, the photoresist film 218 is removed, and a second n-type polycrystalline silicon film is formed all over the surface. A photoresist film 219 is formed in the region where a node electrode is to be formed, the second n-type polycrystalline silicon film, the silicon oxide film 228a, the polycrystalline silicon film 213a and the silicon oxide film 227a are sequentially etched by an anisotropic etching such as an RIE that uses the photoresist film 219 as the mask. As a result of this etching, the second n-type polycrystalline silicon film, the silicon oxide film 228a, the polycrystalline silicon film 213a, and the silicon oxide film 227a are converted to a polycrystalline silicon film 223a, a silicon oxide film 228b, a polycrystalline silicon film 213b, and a silicon oxide film 227b, respectively (FIG. 1C).

Next, after removal of the photoresist film 219, the silicon oxide film 228b sandwiched by the polycrystalline silicon film 223a and the polycrystalline silicon film 213b, and the silicon oxide film 227b sandwiched by the polycrystalline silicon film 213b and the interlayer insulating film 205 are removed by a wet etching which uses hydrofluoric acid. As a result of this treatment, a node electrode 217 of fin structure constituted of an n-type polycrystalline silicon film 223a and an n-type polycrystalline silicon film 213b is formed (FIG. 1D).

Next, a capacitor insulating film 207 is deposited all over the surface. Then, a third n-type polycrystalline silicon film is formed all over the surface, and a cell plate electrode 208 is formed by etching the third n-type polycrystalline silicon film. A stacked type capacitor is formed by removing the capacitor insulating film 207 by etching, using the cell plate electrode 208 as the mask. Next, a second interlayer insulating film 209 is deposited all over the surface, and a bit contact hole 208 is opened by sequentially etching the interlayer insulating films 209 and 205 above the bit diffused layer 204b. Next, a bit line 210 is formed, completing a DRAM (FIG. 1E).

Figure 1D:
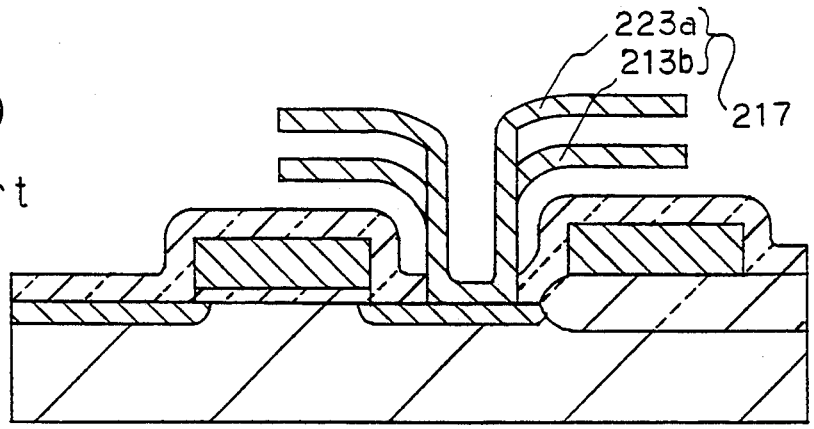
Figure 1E:
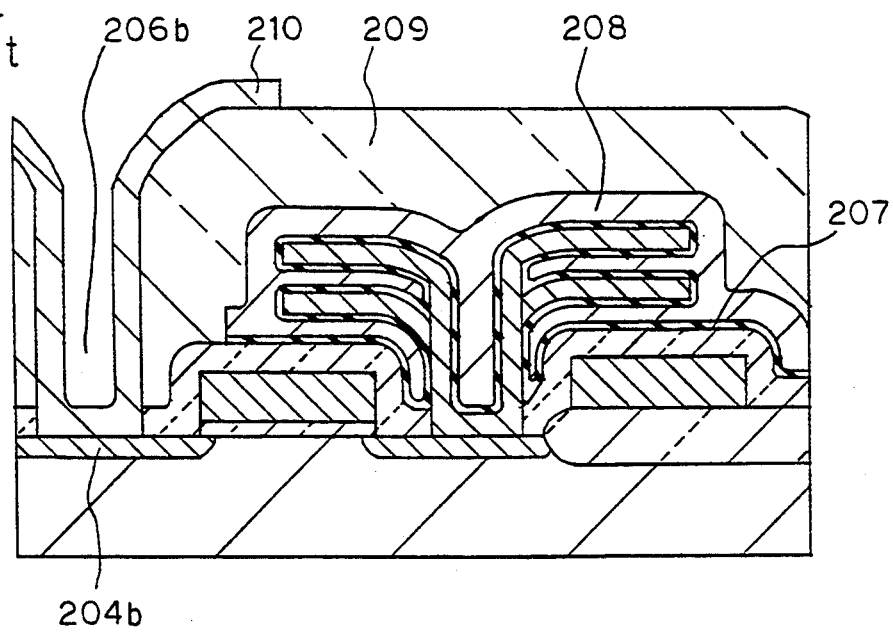

The node electrode 217 of fin structure as shown in FIG. 1D has a sufficiently large surface area. However, according to the method as described in the above, there are required two photolithography processes which makes the formation process long and complex. Moreover, in realizing the structure, in the stage of removing by etching the silicon oxide films 227b and 228b which are sandwiched by a polycrystalline silicon film and an interlayer insulating film or a polycrystalline silicon film, the mechanical strength of the node electrode 217 is deteriorated, making the process such as washing extremely difficult.

Next, referring to the drawings an embodiment of the present invention will be described.

Figure 2A:
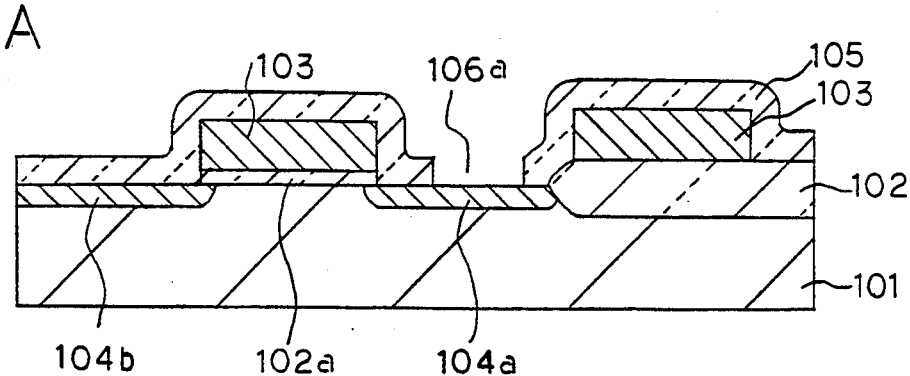
FIGS. 2A to 2E are schematic sectional views arranged in the order of processes to describe the manufacturing method of a first embodiment of the semiconductor memory device of the present invention.

Referring to FIGS. 2A to 2E which are schematic sectional views arranged in the order of the processes to describe the manufacturing method of the first embodiment of the present invention, in the manufacture of the semiconductor memory device according to the present invention, first, an active region and an element isolation region are partitioned by forming a field oxide film 102 on the surface of a p-type silicon substrate 101. After formation of the gate oxide film 102a on the active region, a gate electrode 103 which is served also as a word line is formed. An n-type node diffused layer 104a and a bit diffused layer 104b are formed on the surface of the active region by using the gate electrode 103 on the active region as the mask, completing a MOS transistor of a DRAM. A first interlayer insulating film 105 consisting of a silicon oxide film with thickness of, for example, about 300 nm is formed all over the surface. The interlayer insulating film 105 needs not have at least its surface be constituted of a silicon nitride film, as is the case in the conventional device. Next, the structure shown in FIG. 2A is obtained by opening a node contact hole 106a by etching the interlayer insulating film 105 on the node diffused layer 104a.

Figure 2B:
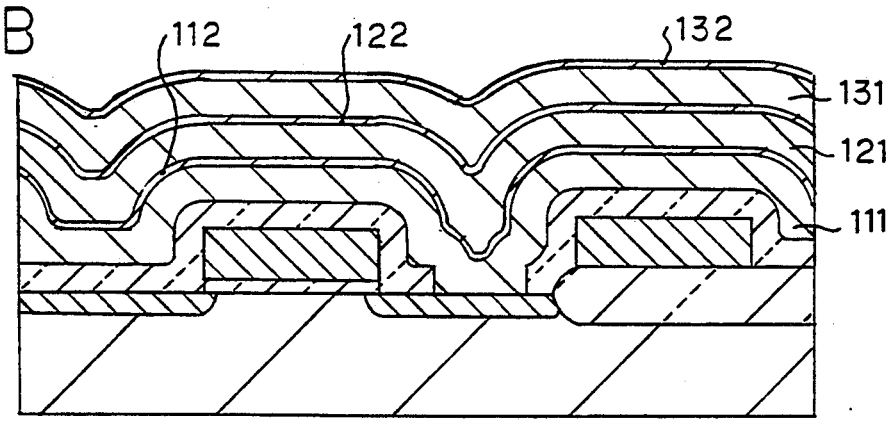

Next, a undoped polycrystalline silicon film 111 with thickness of, for example, about 150 nm is deposited by thermal decomposition of silane ($SiH_4$) within the temperature range of 500° to 600° C. in an LPCVD apparatus. Subsequently, an oxygen-rich undoped polycrystalline silicon film 112 is formed by exposing the sample to an argon atmosphere containing 0.2 to 5% of oxygen ($O_2$) in the same apparatus. By repeating the similar operation for two more times, an undoped polycrystalline silicon film 121, an oxygen-rich undoped polycrystalline silicon film 122, a undoped polycrystalline silicon film 131, and an oxygen-rich undoped polycrystalline silicon film 132 are formed sequentially to form a stacked polycrystalline silicon film, obtaining the structure as shown in FIG. 2B.

Figure 3:
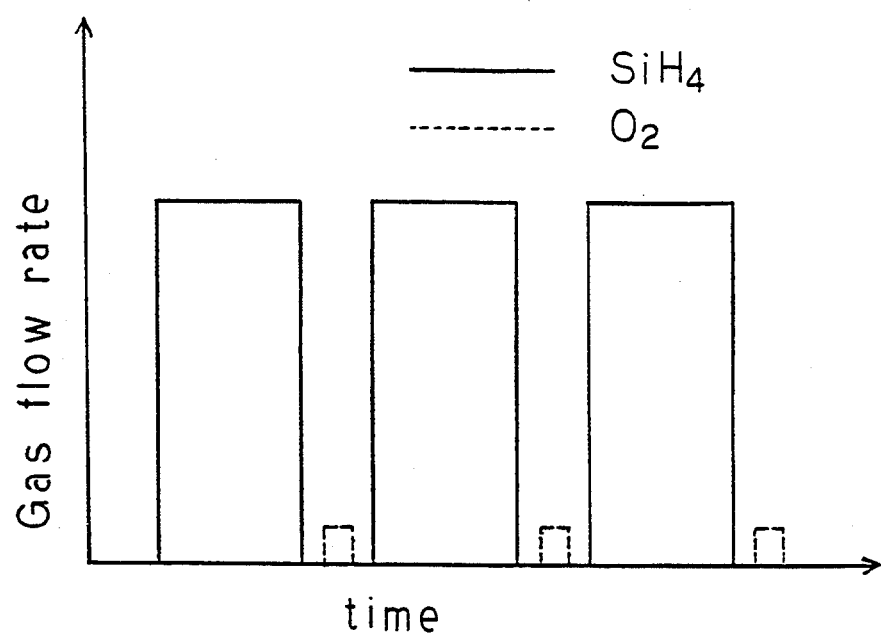
FIG. 3 is a diagram for describing the manufacturing method of a stacked film which constitutes the node electrode of the first embodiment of the semiconductor memory device of the present invention, which is a graph showing the change with the time of the flow rate of the gas used for film formation.

In the above-mentioned processing, the flow rate of silane and argon diluting oxygen are changed periodically as shown, for example, in FIG. 3. The film thicknesses of the oxygen-rich undoped polycrystalline silicon films 112, 122, and 132 formed on the surfaces of the undoped polycrystalline silicon films 111, 121, and 131, respectively, are determined by the temperature, pressure, and oxygen partial pressure within the LPCVD apparatus, duration of the operation, and the like, but they are considered to be the thicknesses corresponding to silicon layers with one to several atomic layers. At this time, it is considered that the bonding between oxygen and silicon is not forming the complete structure of silicon dioxide ($SiO_2$).

Next, the sample is taken out of the LPCVD apparatus and is subjected to diffusion by phosphoryl trichloride ($POCl_3$) bubbling at 800° to 850° C. to convert the undoped polycrystalline silicon films 111, 121, and 131 and the oxygen-rich undoped polycrystalline silicon films 112, 122, and 132 to n-type semiconductor films. For the above-mentioned range of the temperature the thickness of the oxygen-rich n-type polycrystalline silicon film is 5 to 200 nm, and the sheet resistance of the film is 200 to 1000 $\Omega/\square$ or so. The reason for this is considered due to dispersion, in broader manner into silicon crystals, of oxygen contained in the oxygen-rich undoped polycrystalline silicon film instead of forming the oxide of silicon, as a result of diffusion of phosphorus and the accompanying heat treatment. The fact that the lowermost undoped polycrystalline silicon film 111 is also converted to n-type by the phosphorus diffusion lends support to the consideration that oxygen in the oxygen-rich undoped polycrystalline silicon film does not form the completely bonded compound of $SiO_2$.

Figure 4:
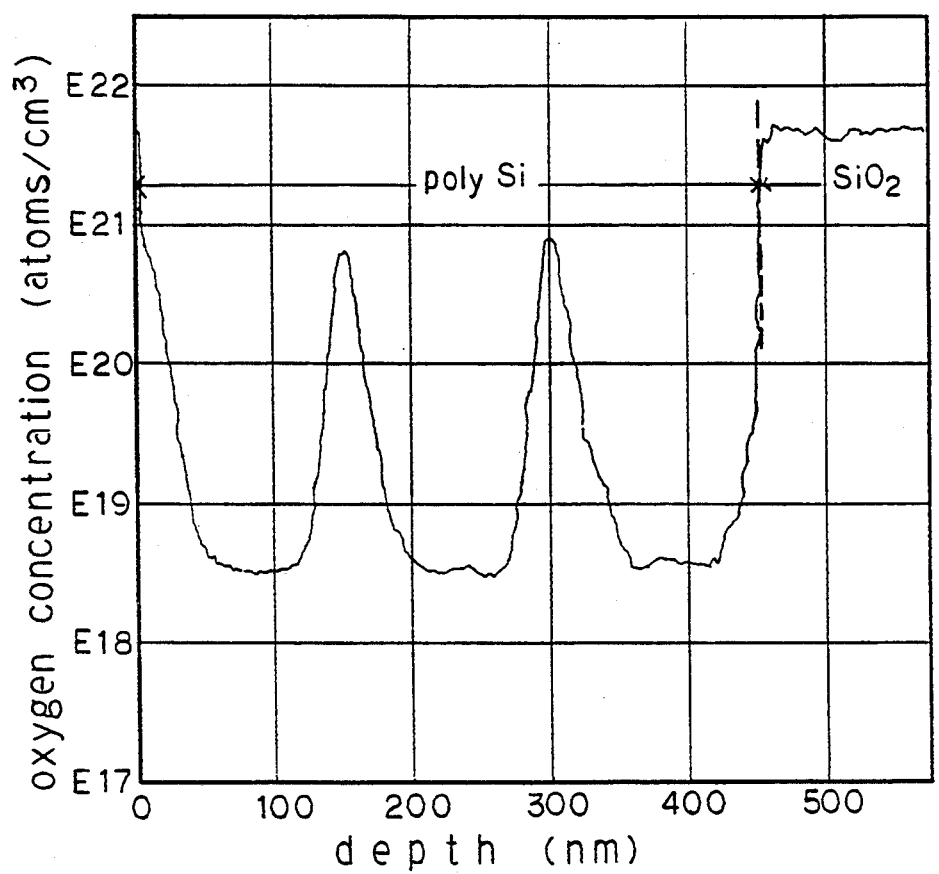
FIG. 4 is a graph showing the depth profile of the oxygen concentration in the stacked film which constitutes the node electrode of the first embodiment of the semiconductor memory device.

In the stacked film consisting of n-type polycrystalline silicon formed over the interlayer insulating film 105 (the flat portion above the gate electrode 103), for example, the depth profile of the oxygen concentration is as shown in FIG. 4. This result represents a measurement by secondary ion mass spectrometry (SIMS). The oxygen concentration has three peaks; a first peak on the surface, a second peak at a depth of about 150 nm, and a third peak at a depth of about 300 nm. The second and the third peaks have a considerable spectral width, and the maximum oxygen concentrations at these peaks are about one order of magnitude smaller than the oxygen concentration of a silicon oxide film. The first peak is in the state of superposition of a region of extremely high oxygen concentration (about $5 \times 10^{21}$ atoms/cm$^3$ which is comparable to the oxygen concentration of the interlayer insulating film) in a very narrow range, and a region which is the same order as those of the second and the third peaks. The region of the first peak with extremely high oxygen concentration corresponds to the region of natural oxide formed on the surface of the stacked film.

Figure 2C:
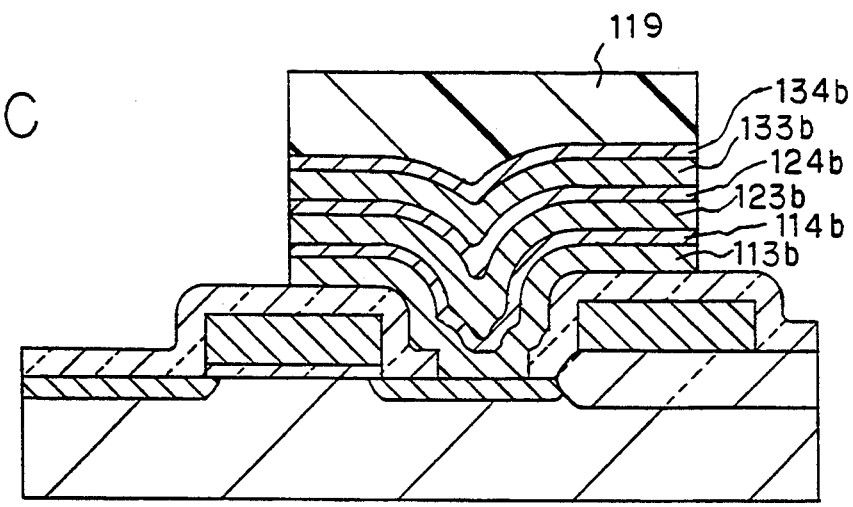

Next, a photoresist film 119 is formed in the region reserved for a node electrode, and an anisotropic etching is applied to the stacked film consisting of the n-type polycrystalline silicon. As a result, in the region for forming the node electrode there is formed a stacked film consisting of an oxygen-rich n-type polycrystalline silicon film 134b, an n-type polycrystalline silicon film 133b, an oxygen-rich n-type polycrystalline silicon film 124b, an n-type polycrystalline silicon film 123b, an oxygen-rich n-type polycrystalline silicon film 114b, and an n-type polycrystalline silicon film 113b, as shown in FIG. 2C. The side faces of the stacked film is approximately flat. The anisotropic etching is an RIE that uses dichlorodifluoromethane ($CCl_2F_2$) of about 40 sccm as the etchant gas, carried out under a pressure of about 200 m Torr and an RF power of about 300 W.

Figure 2D:
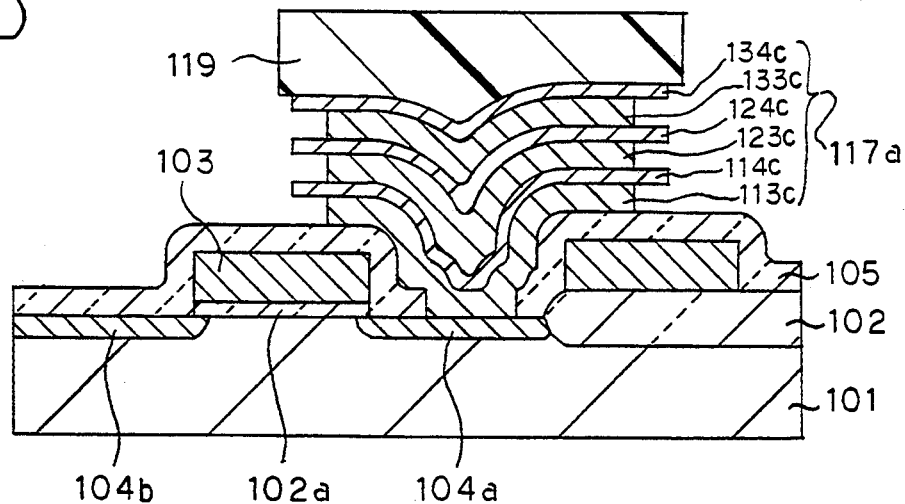

Next, an isotropic etching is applied without removal of the photoresist film 119 to the exposed surfaces of the stacked film, by using sulfur hexafluoride ($SF_6$) as the etchant gas. As a result of the etching, the oxygen-rich n-type polycrystalline silicon film 134b, the n-type polycrystalline silicon film 133b, the oxygen-rich n-type polycrystalline silicon film 124b, the n-type polycrystalline silicon film 123b, the oxygen-rich n-type polycrystalline silicon film 114b, and the n-type polycrystalline silicon film 113b are converted respectively to an oxygen-rich n-type polycrystalline silicon film 134c, an n-type polycrystalline silicon film 133c, an oxygen-rich n-type polycrystalline silicon film 124c, an n-type polycrystalline silicon film 123c, an oxygen-rich n-type polycrystalline silicon film 114c, and an n-type polycrystalline silicon film 113c, as shown in FIG. 2D, completing a node electrode 117a of the stacked capacitor of the present embodiment consisting of these stacked films.

Here, by the adoption of isotropic etching by the use of sulfur hexafluoride there is formed a ruggedness on the side faces of the node electrode due to the indentations of the n-type polycrystalline silicon films 113c, 123c, and 133c, because of the slower rate of etching of the oxygen-rich n-type polycrystalline silicon film than the n-type polycrystalline silicon film that does not contain oxygen (or is oxygen-poor). The isotropic etching employed here is carried out, for example, using sulfur hexafluoride of 60 sccm as the etchant gas and helium (He) of 100 sccm as the carrier gas, under a pressure of 400 m Torr and an RF power of 400 W.

Figure 5:
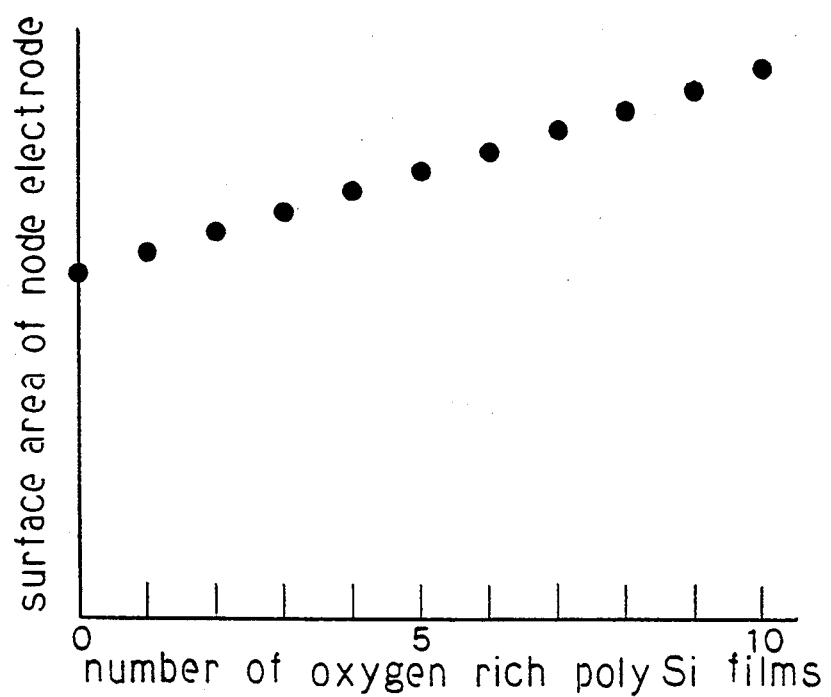
FIG. 5 is a diagram for describing the effect of the first embodiment, which is a graph showing the change in the surface area of the node electrode as a function of the number of layers of the oxygen-rich polycrystalline silicon film.

The indentations in this case is about 0.1 to 0.3 $\mu$m. Although the increase in the surface area of the node electrode 117a due to individual indentation is small, for example, even if the increase in the surface area due to a single indentation is about 6%, the surface area of the node electrode can be increased by increasing the layer number of the oxygen-rich polycrystalline films, as shown in FIG. 5. In the present embodiment the layer number of the n-type polycrystalline silicon films that do not contain oxygen (or are oxygen-poor) is three, and the thickness of each film is about 150 nm, so that the increase in the surface area of the node electrode is about 18%. However, by reducing the thickness of the n-type polycrystalline silicon film containing no oxygen (or being oxygen-free) is reduced to about 50 nm, and increasing the number of films from 3 to 10 layers, for example, the increase in the surface area of the node electrode can be made about 60%.

Figure 2E:
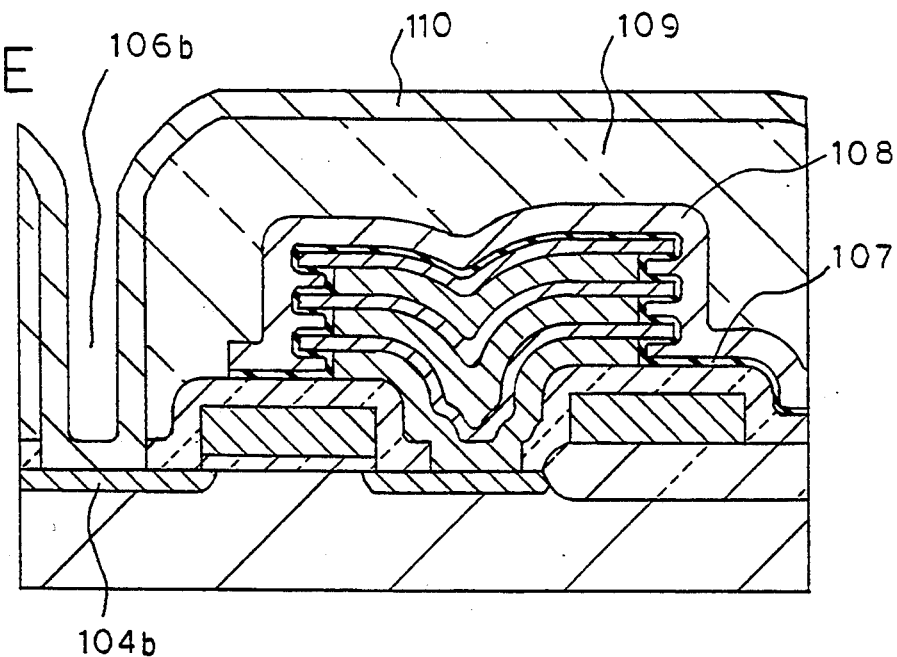

Next, the photoresist film 119 is removed, and a capacitor insulating film 107 and a cell plate electrode 108 are formed, completing a stacked capacitor. Subsequently, a second interlayer insulating film 109 is deposited all over the surface, and a bit contact hole 106b is opened by sequentially etching the interlayer insulating films 109 and 105 on the bit diffused layer 104b. Finally, a bit line 110 is formed to complete a DRAM which is equipped with the node electrode 117a of the first embodiment as shown in FIG. 2E.

As described in the above, the present embodiment makes it possible to obtain the fin structure in smaller number of steps of one time of photolithography process (and two times of etching process) compared with the conventional manufacturing method. Furthermore, the depth of the indentation of the fins is about 0.3 µm at the most so that the mechanical strength at the stage of formation of the node electrode can be secured. Moreover, as described in the above, the number of indentations on the side faces of the node electrode can readily be increased, so that it is easy to obtain a capacitor having large capacitance even if the occupancy area of the stacked capacitor has to be decreased.

Figure 6A:
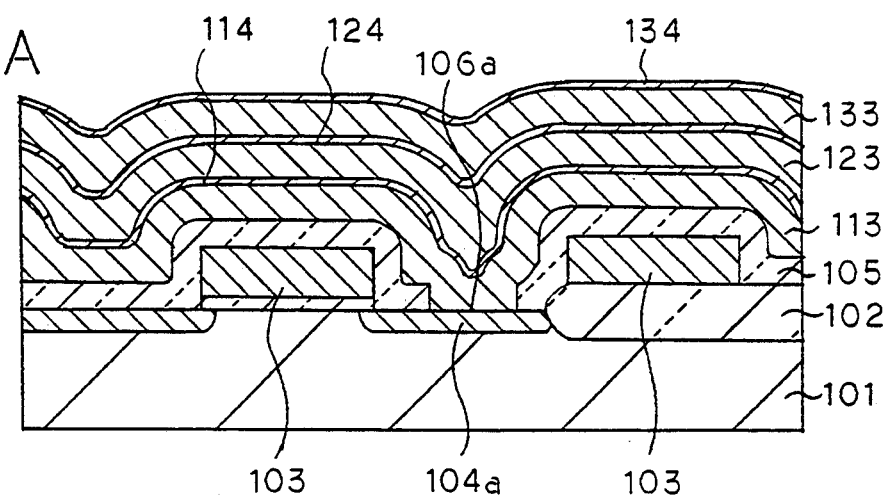
FIGS. 6A and 6B are schematic sectional views of the principal processes for describing the manufacturing method of a second embodiment of the semiconductor memory device of the present invention.
Figure 6B:
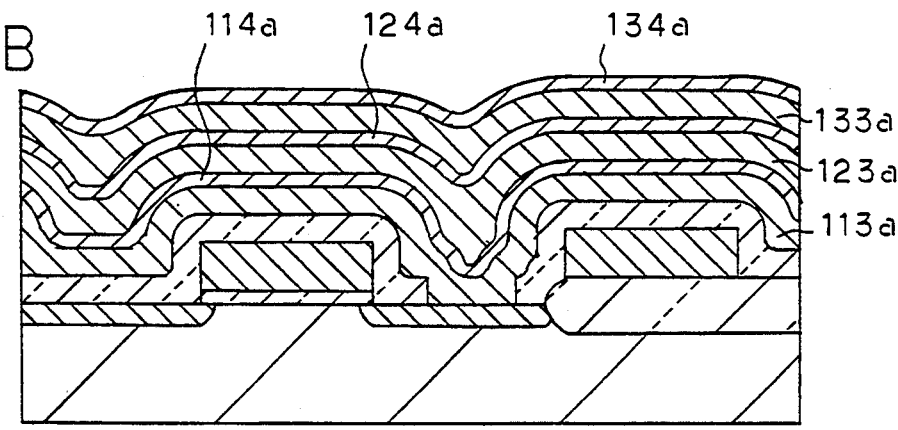

Referring to FIGS. 6A and 6B which are schematic sectional views of the principal processes to describe the manufacturing method of the second embodiment of the semiconductor memory device of the present invention, it can be seen that the formation of the present embodiment is the same as that of the first embodiment up to the process shown in FIG. 2A.

Next, an n-type polycrystalline silicon film 113 with thickness of about 150 nm, for example, is deposited in the LPCVD apparatus by means of thermal decomposition that uses a mixed gas of silane ($SiH_4$) and phosphine ($PH_3$) in the temperature range of 500° to 600° C. Then, an oxygen-rich n-type polycrystalline silicon film 114 is formed on the surface of the polycrystalline silicon film 113 by exposing the sample to an argon atmosphere containing 0.2 to 5% of oxygen ($O_2$) within the same apparatus. By the repetition of similar operation for two more times, an n-type polycrystalline silicon film 123, an oxygen-rich n-type polycrystalline silicon film 124, an n-type polycrystalline silicon film 133, and an oxygen-rich n-type polycrystalline silicon film 134 are formed sequentially to form a stacked polycrystalline silicon film, obtaining the structure as shown in FIG. 6A.

Next, by a heat treatment in an inert atmosphere at 600° to 850° C., the oxygen-rich n-type polycrystalline silicon film 134, the n-type polycrystalline silicon film 133, the oxygen-rich n-type polycrystalline silicon film 124, the n-type polycrystalline silicon film 123, the oxygen-rich n-type polycrystalline silicon film 114, and the n-type polycrystalline silicon film 113 are respectively converted to an oxygen-rich n-type polycrystalline silicon film 134a, an n-type polycrystalline silicon film 133a, an oxygen-rich n-type polycrystalline silicon film 124a, an n-type polycrystalline silicon film 123a, an oxygen-rich n-type polycrystalline silicon film 114a, and an n-type polycrystalline silicon film 113a, as shown in FIG. 6B. The purpose of the heat treatment is to disperse oxygen in, for example, the oxygen-rich n-type polycrystalline silicon film 114, and as a result, the thickness of the oxygen-rich n-type polycrystalline silicon film 114a is increased more than the thickness of the oxygen-rich n-type polycrystalline silicon film 114.

Subsequently, a node electrode of the present embodiment is completed through processes similar to those shown in FIGS. 2C and 2D of the first embodiment. Further, a DRAM equipped with the node electrode of the present embodiment is completed by the same manufacturing method as shown in FIG. 2E of the first embodiment.

In the present embodiment, a stacked film is formed consisting of polycrystalline silicon films which are n-type from the beginning. The growth rate of the n-type polycrystalline silicon film by the above-mentioned method is smaller than the growth rate of the undoped polycrystalline silicon film of the first embodiment. According to the method of the present embodiment it becomes possible to form with high accuracy an n-type polycrystalline silicon film with small thickness. Moreover, the thickness of the oxygen-rich n-type polycrystalline silicon film 114a, for example, depends on the conditions of the heat treatment. Therefore, the thickness of the n-type polycrystalline silicon film 113a and the oxygen-rich n-type polycrystalline silicon film 114a, for example, can further be reduced compared with the first embodiment. As a result, the present embodiment makes it possible to further increase the surface area of the side faces of the node electrode than in the first embodiment.

It should be mentioned that the stacked film consisting of the polycrystalline silicon films in the first and the second embodiments were made by an LPCVD method. However, there exists an alternative method of forming small the thickness of the oxygen-rich polycrystalline film and the thickness of the polycrystalline silicon film which does not contain oxygen (or is oxygen-poor), with high controllability by means of an MBE apparatus.

Referring to FIGS. 7A to 7D which show schematic sectional views of the principal processes to describe the third embodiment of the present invention and the manufacturing method thereof, the present embodiment is formed in the same way as in the first embodiment up to the process as shown in FIG. 2A.

Figure 7A:
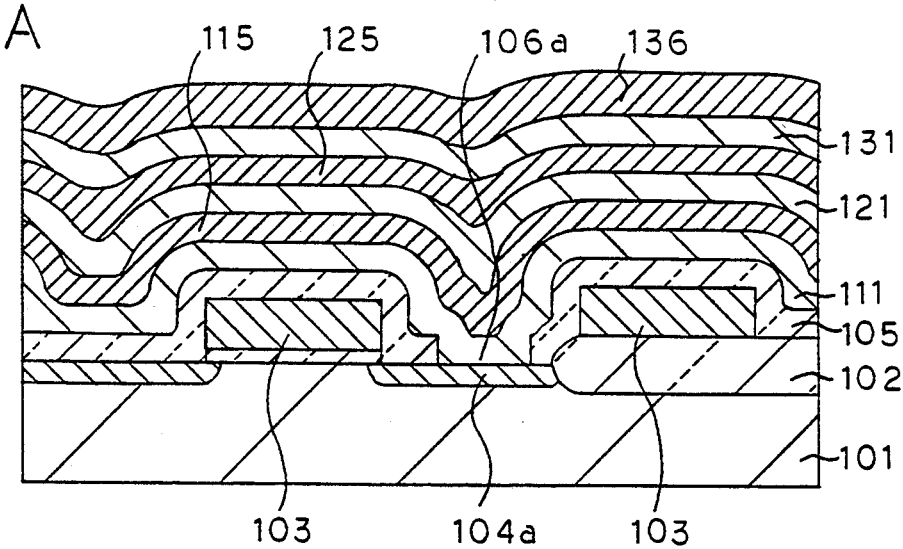
FIGS. 7A to 7D are schematic sectional views arranged in the order of the processes to describe the manufacturing method of a third embodiment of the semiconductor memory device of the present invention.

Next, an undoped polycrystalline silicon film 111 with thickness of, for example, 100 nm by thermal decomposition of silane ($SiH_4$) within the LPCVD apparatus in the temperature range of 500° to 600° C. Subsequently, a tungsten silicide film 115 with thickness of, for example, about 50 nm is formed on the polycrystalline silicon film 111 by the reaction of tungsten hexafluoride ($WF_6$) akd silane (the so-called silane reduction method) within the same apparatus. Since the growth rate of the tungsten silicide film is a fraction of the growth rate of the undoped polycrystalline silicon film 111, the tungsten silicide film can be formed with high accuracy in the thickness. By repeating similar operation for two more times, an undoped polycrystalline silicon film 121 with thickness of about 100 nm, a tungsten silicide film 125 with thickness of about 50 nm, an undoped polycrystalline silicon film 131 with thickness of about 100 nm, and a tungsten silicide film 136 with thickness of about 100 nm are formed, obtaining the structure as shown in FIG. 7A. Here, the tungsten silicide film 136 is set to have a greater thickness than the thicknesses of other tungsten silicide films 115 and 125. In addition, in the stacked film in the present embodiment consisting of the polycrystalline silicon films and the tungsten silicide films, it is preferable that the lowermost film be a polycrystalline silicon film. This is for obtaining satisfactory close contact and ohmic contact property between the node diffused layer 104a and the node electrode yet to be formed in the node contact hole 106a.

Figure 7B:
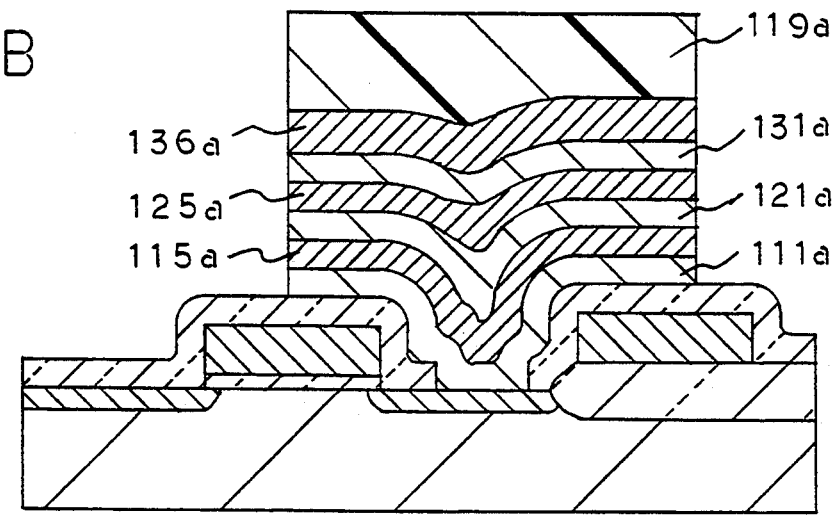

Next, a photoresist film 119a is formed in the region for forming the node electrode. Subsequently, a stacked film consisting of a tungsten silicide film 136a, an undoped polycrystalline silicon film 131a, a tungsten silicide film 125a, an undoped polycrystalline silicon film 121a, a tungsten silicide film 115a, and an undoped polycrystalline silicon film 111a is formed at the position for forming the node electrode by means of an anisotropic etching, as shown in FIG. 7B. This anisotropic etching is an RIE which uses tetrafluoromethane ($CF_4$). The etching conditions are: a flow rate of 50 sccm of tetrafluoromethane, a pressure of 100 m Torr, and an RF power of 300 W. In this etching, the interlayer insulating film 105 cannot act as a stopper for the etching because of the high etching rate for the silicon oxide film. For this reason, the etching of the lowermost undoped polycrystalline film 111 requires a through attention.

Figure 7C:
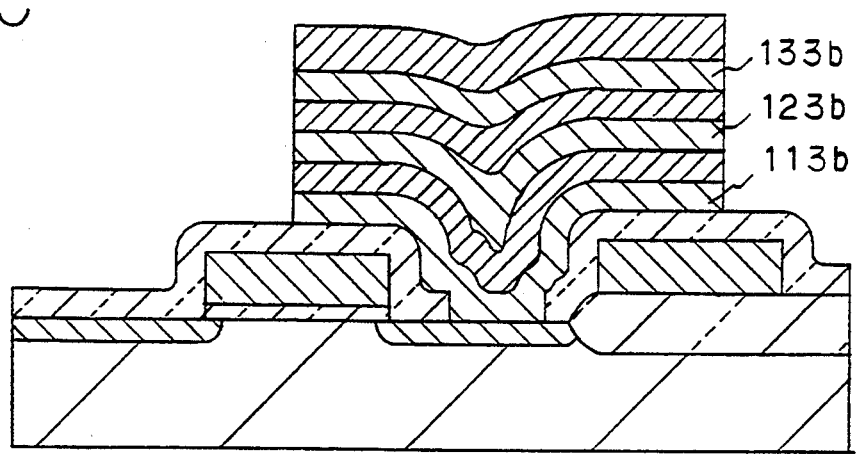
Figure 7D:
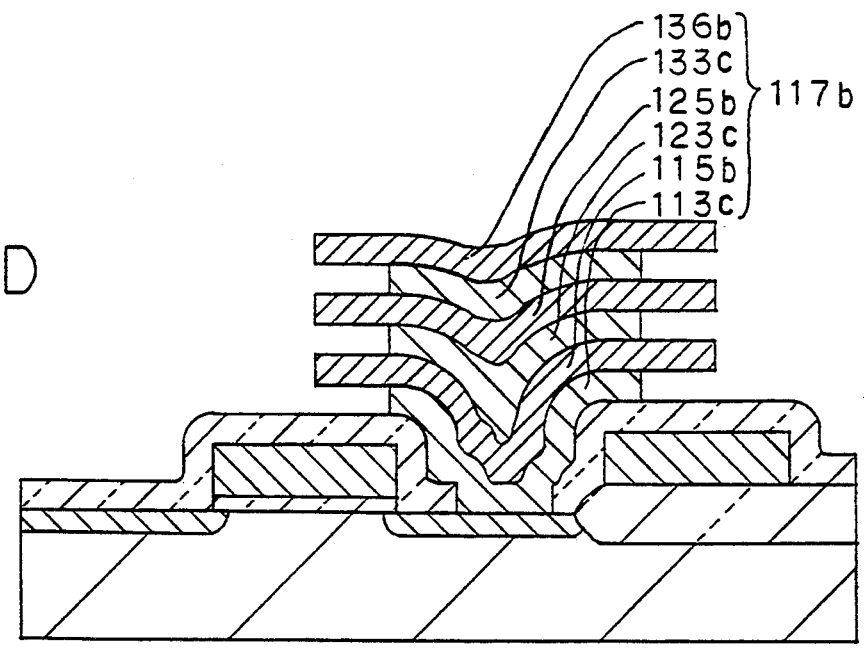

Next, the photoresist film 119 is removed to give diffusion of phosphorus. As a result of the diffusion, the undoped polycrystalline silicon films 131a, 121a, and 111a are converted to the respectively n-type polycrystalline silicon films 133b, 123b, and 113b as shown in FIG. 7C. That this diffusion of phosphorus is possible is due to the fact that the diffusion coefficient in the polycrystalline silicon film is greater than that in single crystal silicon by about one order of magnitude.

Next, by subjecting the sample to an isotropic etching which uses an etchant gas that contains sulfur hexafluoride ($SF_6$), the stacked film consisting of the tungsten silicide film 136a, the n-type polycrystalline silicon film 133b, the tungsten silicide film 125a, the n-type polycrystalline silicon film 123b, the tungsten silicide film 115a, and the n-type polycrystalline silicon film 113b is converted to a stacked film consisting of a tungsten silicide film 136b, an n-type polycrystalline silicide film 133c, a tungsten silicide film 125b, an n-type polycrystalline silicon film 123c, a tungsten silicide film 115b, and an n-type polycrystalline silicon film 113c. A node electrode 117b is constituted of this stacked film. Since the etching rate of the n-type polycrystalline silicon film is sufficiently large (high selection ratio) compared with the etching rate of the tungsten silicide film, there are formed indentations due to the n-type polycrystalline silicon films on the side faces of the node electrode 117b. In order to form these indentations in an effective manner it is preferable that the topmost layer is a tungsten silicide film rather than a polycrystalline silicon film. Since the thickness of the tungsten silicide film 136a in the uppermost layer is reduced during the etching, it is preferable that this layer is set to have a larger thickness than other tungsten silicide film, as mentioned in the above.

The isotropic etching by an etchant gas containing sulfur hexafluoride ($SF_6$) will be described in more detail. In a dry etching, for example, which uses an etchant gas of the mixture of sulfur hexafluoride of 50 sccm and chlorine ($Cl_2$) gas of 50 sccm and carried out a pressure of 100 to 150 m Torr and an RF power of 200 to 300 W, the etching rates of the tungsten silicide film and the n-type polycrystalline silicon film are 70 to 90 nm/min and 600 to 700 nm/min, respectively. In addition to the above, sulfur hexafluoride alone, or mix gas of sulfur hexafluoride and hydrogen bromide (HBr) may also be used as the etchant gas. It is preferable that this isotropic etching is applied after conversion of the polycrystalline silicon films to the n-type films. In the undoped polycrystalline silicon film, the selectivity ratio of the etching rate of this film with respect to that of the tungsten silicide film is reduced.

Next, a DRAM including the node electrode according to the present embodiment is completed by forming a capacitor insulating film, a cell plate electrode, a second interlayer insulating film, a bit contact hole, and a bit line in the same manner as in the first embodiment. It should be noted that in the first and the second embodiments it is possible to adopt a silicon oxide film obtained by thermal oxidation as the capacitor insulating film. However, in the present embodiment, it is necessary to form the capacitor insulating film by a CVD method, such as a silicon nitride film obtained by the CVD method that uses, for example, dichlorosilane ($SiH_2C_2$) and ammonia ($NH_3$) gas.

As described in the above, in the isotropic etching in the formation of the node electrode, the etching rate of the n-type polycrystalline silicon film is sufficiently larger than the etching rate of the tungsten silicide film, so that the indentations formed on the side faces of the node electrode in the present embodiment have greater depth than in the indentations of the first and the second embodiments. Moreover, the surface area of the node electrode becomes larger than those in the first and the second embodiments.

In the present embodiment, the n-type polycrystalline silicon film was used as the first conductor film and the tungsten silicide film was used as the second conductor film. However, it is possible to use another silicide film of a high melting point metal, such as a molybdenum silicide film or a titanium silicide film, as the second conductor film.

It should further be noted that in the isotropic etching in the present embodiment for the formation of the gate electrode of the so-called polycide structure with a lower layer consisting of an n-type polycrystalline silicon film and an upper layer consisting of a high melting point metal silicide film, we have actively used conversely the inconvenient fact that undercuts tend to be generated in the n-type polycrystalline silicon film in the lower layer.

Figure 8A:
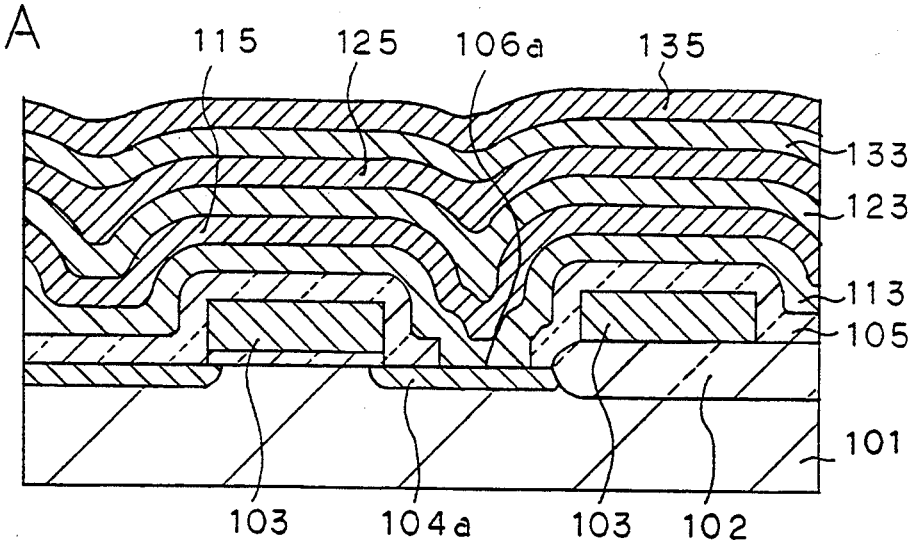
FIGS. 8A to 8C are schematic sectional views arranged in the order of the processes to describe the manufacturing method of a fourth embodiment of the semiconductor memory device of the present invention.
Figure 8B:
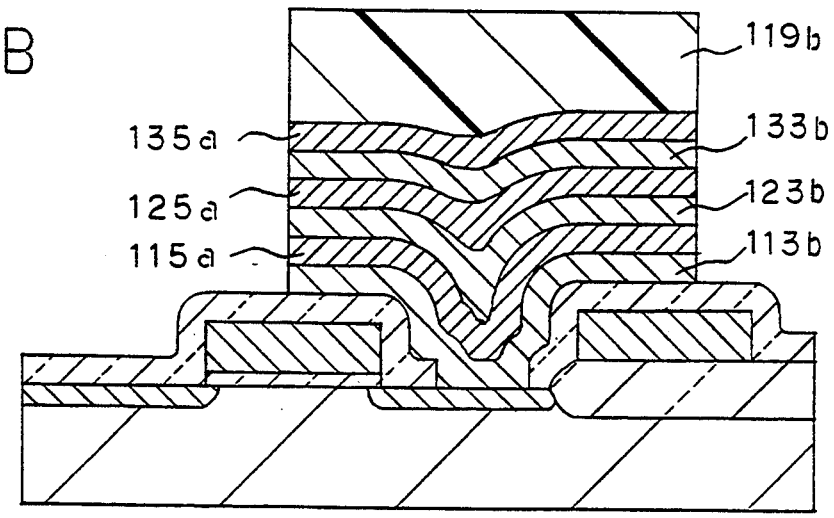
Figure 8C:
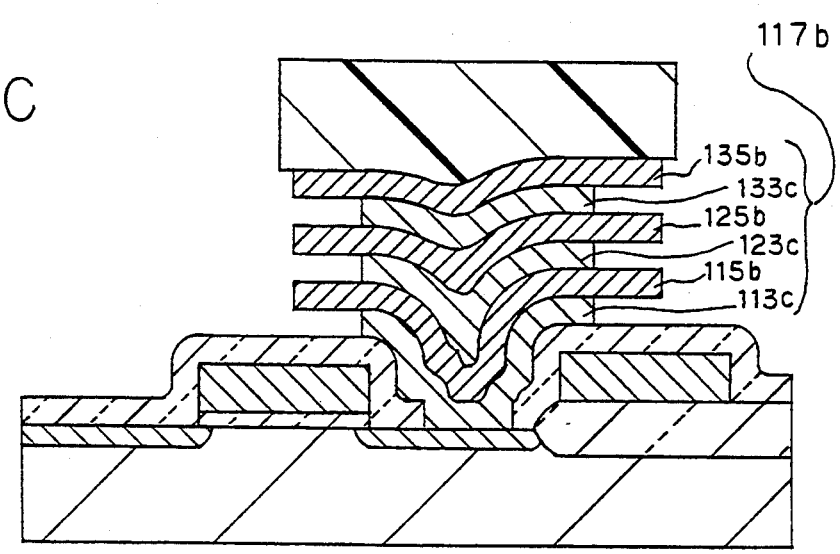

Referring to FIGS. 8A to 8C which are schematic sectional views of the principal processes to describe the manufacturing method of the fourth embodiment of the semiconductor memory device of the present invention, the present embodiment is formed in the same way as in the first embodiment up to the process shown in FIG. 2A.

Next, an n-type polycrystalline silicon film 113 with thickness of, for example, of about 75 nm by thermal decomposition of a mixed gas of silane ($SiH_4$) and phosphine ($PH_3$) in the temperature range of 500° to 600° C. within the LPCVD apparatus. Subsequently, a tungsten silicide film 115 with thickness of, for example, about 75 nm is formed on the polycrystalline silicon film 113 by the reaction within the same apparatus of tungsten hexafluoride ($WF_6$) and silane (the so-called silane reduction method). The growth rates of the tungsten silicide film and the n-type polycrystalline silicon film are approximately the same, being a fraction of the growth rate of the undoped polycrystalline silicon film 111 in the third embodiment, so that the tungsten silicide film and the n-type polycrystalline silicon film can be formed with high accuracy of the thickness. By repeating the similar operation for two more times, an n-type polycrystalline film 123 with thickness of about 75 nm, a tungsten silicide film 125 with thickness of about 75 nm, an n-type polycrystalline silicon film 133, and a tungsten silicide film 135 with thickness of about 75 nm are formed, obtaining the structure as shown in FIG. 8A.

Next, a photoresist film 119b is formed in the region where a node electrode is to be formed. Subsequently, a stacked film consisting of a tungsten silicide film 135a, an n-type polycrystalline silicon film 133b, a tungsten silicide film 125a, an n-type polycrystalline silicon film 123b, a tungsten silicide film 115a, and an n-type polycrystalline silicon film 113b is formed at the position where the node electrode is to be formed by an anisotropic etching as shown in FIG. 8B. This anisotropic etching is carried out under the same conditions as in the third embodiment.

Next, by an isotropic etching using an etchant gas containing sulfur hexafluoride (SF$_6$) is carried out under the same conditions as in the third embodiment, without removal of the photoresist film 119b, to form a node electrode 117b of the present embodiment formed by a stacked film consisting of a tungsten silicide film 135b, an n-type polycrystalline silicon film 133c, a tungsten silicide film 125b, an n-type polycrystalline silicon film 123c, a tungsten silicide film 115b, and an n-type polycrystalline silicon film 113c, as shown in FIG. 8C.

Next, a DRAM having the node electrode of the present embodiment is obtained by forming a capacitor insulating film, a cell plate electrode, a second interlayer insulating film, a bit contact hole, and a bit line in the same way as in the first embodiment.

The present embodiment is superior to the third embodiment in the controllability of the formation of the tungsten silicide film and the n-type polycrystalline silicon film. Therefore, it becomes easier to increase the number of identations in the side faces of the node electrode by setting the thickness of each film thinner, making it easy to increase the surface area of the node electrode compared with the third embodiment.

In the first, the second, the third, and the fourth embodiments, the n-type polycrystalline silicon film is used as the first conductor film, the oxygen-rich polycrystalline silicon film or the tungsten silicide film is used as the second conductor film, and dry etching using an etchant gas containing at least sulfur hexafluoride (SF$_6$) is employed as the isotropic etching, but the present invention is by no means limited to the above-mentioned combination. One of the conditions in the selection of the materials for the first and the second conductor films is that the selectivity ratio of the etching rates of the first and the second conductor films for the isotropic etching has a sufficiently large value.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. In a method of manufacturing a node electrode of a dynamic random access memory consisting essentially of one MOS transistor and one stacked capacitor, the method of manufacturing a semiconductor memory device comprising the processes of:

forming a MOS transistor consisting essentially of a gate electrode serving both as a gate electrode with a gate insulating film and as a word line, an n-type node diffused layer and an n-type bit diffused layer that are formed on the surface of a p-type silicon substrate, depositing an interlayer insulating film over all of a surface of the MOS transistor, and opening a node contact hole in said interlayer insulating film that reaches said node diffused layer;

forming a stacked film by alternately depositing a first conductor film and a second conductor film wherein, said first conductor film consists essentially of an n-type polycrystalline silicon film, and said second conductor film consists essentially of an oxygen-rich n-type polycrystalline silicon film, and the formation process of said stacked film comprises the processes of:

carrying out alternately deposition of an undoped polycrystalline silicon film, and formation of an oxygen-rich undoped polycrystalline silicon film on the surface of said undoped polycrystalline silicon film by exposing said undoped polycrystalline silicon film to an oxygen atmosphere, and forming a first stacked film consisting essentially of said undoped polycrystalline silicon film and said oxygen-rich undoped polycrystalline silicon film; and diffusing phosphorus into said first stacked film;

forming a photoresist film in a region for forming a node electrode, and anisotropically etching said stacked film using said photoresist film as a mask; and isotropically etching at least a surface of said stacked film exposed by said anisotropic etching.

2. A method of manufacturing a semiconductor memory device as claimed in claim 1, wherein said isotropic etching is a dry etching which uses an etchant gas that contains at least sulfur hexafluoride.

3. In a method of manufacturing a node electrode of a dynamic random access memory consisting essentially of one MOS transistor and one stacked capacitor, the method of manufacturing a semiconductor memory device comprising the processes of:

forming a MOS transistor consisting essentially of a gate electrode serving both as a gate electrode with a gate insulating film and as a word line, an n-type node diffused layer and an n-type bit diffused layer that are formed on the surface of a p-type silicon substrate, depositing an interlayer insulating film over all of a surface of the MOS transistor, and opening a node contact hole in said interlayer insulating film that reaches said node diffused layer;

forming a stacked film by alternately depositing a first conductor film and a second conductor film wherein, said first conductor film consists essentially of an n-type polycrystalline silicon film, and said second conductor film consists essentially of an oxygen-rich n-type polycrystalline silicon film, and the formation process of said stacked film comprises the processes of:

carrying out alternately deposition of said n-type polycrystalline silicon film by a CVD method that uses silane gas containing phosphine, and formation of said oxygen-rich n-type polycrystalline silicon film on the surface of said n-type polycrystalline silicon film by exposing said n-type polycrystalline silicon film to an oxygen atom; and carrying out a heat treatment in an inert atmosphere:

forming a photoresist film in a region for forming a node electrode, and anisotropically etching said stacked film using said photoresist film as a mask; and isotropically etching at least a surface of said stacked film exposed by said anisotropic etching.

* * * * *